United States Patent [19]

Zehender et al.

[11] 4,085,248

[45] Apr. 18, 1978

[54] METHOD TO APPLY A PROTECTIVE LAYER TO THE SURFACE OF OPTICAL REFLECTORS, AND SO-MADE REFLECTORS, PARTICULARLY AUTOMOTIVE VEHICLE HEAD LAMPS

[75] Inventors: Ernst Zehender, Ottenbronn; Bernhard Blaich, Stuttgart; Helmut Stein, Ditzingen; Karl Kerner, Gerlingen, all of Germany

[73] Assignee: Robert Bosch GmbH, Stuttgart, Germany

[21] Appl. No.: 716,107

[22] Filed: Aug. 20, 1976

[30] Foreign Application Priority Data

Aug. 22, 1975 Germany ............................... 2537416
Jun. 5, 1976 Germany ............................... 2625448

[51] Int. Cl.$^2$ ............................................ B05D 3/06
[52] U.S. Cl. ...................................... 428/336; 427/35; 427/296; 427/38; 427/404; 427/407 C; 428/448; 428/450; 428/462;
[58] Field of Search ................ 427/38, 39, 427/40, 41, 427/322, 35, 36, 295, 296; 204/165, 168; 428/336, 333, 450, 462

[56] References Cited

U.S. PATENT DOCUMENTS

| 3,057,792 | 10/1962 | Frohlich | 427/40 |
| 3,068,510 | 12/1962 | Coleman | 427/41 |
| 3,201,271 | 8/1965 | Simmons et al. | 427/40 |
| 3,968,270 | 7/1976 | Hasegawa | 427/40 |

FOREIGN PATENT DOCUMENTS

| 46-534 | 6/1971 | Japan | 427/39 |
| 900,263 | 7/1962 | United Kingdom | 427/39 |

OTHER PUBLICATIONS

Tkachuk, I, Chem. Abstr., 66,29209 (1967).
Tkachuk, II, Chem. Abstr., 68,70238 (1968).
Smolinsky, Chem. Abstr., 71, 129827 (1969).

*Primary Examiner*—John H. Newsome
*Attorney, Agent, or Firm*—Flynn & Frishauf

[57] ABSTRACT

The reflectors, for example for automotive vehicle head lamps are reflectorized by evaporating aluminum thereon in a vacuum vessel at a vacuum of about $10^{-7}$ bar; thereafter, and without removing the reflectors, a gaseous monomer is introduced raising the pressure to about $5 \times 10^{-6}$ bar to deposit a protective layer by polymerization from the gaseous phase. The monomer gases, preferably, are low molecular weight siloxanes having methyl-, vinyl- or phenyl groups, preferably hexamethyldisiloxane (HMDS), or methyl-, vinyl- or alkoxy silanes, preferably vinyltrimethylsilane (VTMS), polymerization being accelerated and ensured by an electrical discharge generated within the vessel by a heated electron emitter placed at a negative voltage with respect to the reflector blanks. After polymerization, the layer is rendered hydrophilic by treatment with oxygen at a pressure of about $10^{-2}$ to $10^{-3}$m bar to form an organosilicon polymeric protective layer which is inherently hydrophobic and has a hydrophilic surface.

52 Claims, 2 Drawing Figures

METHOD TO APPLY A PROTECTIVE LAYER TO THE SURFACE OF OPTICAL REFLECTORS, AND SO-MADE REFLECTORS, PARTICULARLY AUTOMOTIVE VEHICLE HEAD LAMPS

CROSS REFERENCE TO RELATED APPLICATION:

U.S. Ser. No. 711,842, filed Aug. 5, 1976 Bernhard BLAICH et al (claiming priority of German Application P 25 36 013.8); and assigned to the assignee of the present application.

The present invention relates to a method to make a protective layer on the surface of optical reflectors and reflectors made in accordance with this method, and particularly to a method to provide a protective layer on the reflective surface of automotive headlights and other electric lamps which are exposed to severe environmental conditions; and to apparatus therefor.

It has previously been proposed to provide protective layers on the surface of optical reflectors which have a reflective coating vapor deposited thereon, for example an aluminum coating. These reflectors are placed in a vacuum vessel in which the aluminum is evaporated and the reflective layer is applied thereafter. Known reflective layers to protect the aluminum coating against the influences of corrosion were heretofore usually generated by depositing inorganic substances. These methods were particularly applied to reflectors for automotive vehicle headlights and the like. The process was carried out in this manner: The headlight reflectors were located within deposition vessel which, besides the apparatus to deposit the highly reflective metal coating, also included a further deposition means to apply the protective layer. As proposed, such a protective layer may consist of evaporated magnesium fluoride ($MgF_2$) or it might have been obtained by reactive deposition of SiO in an oxygen atmosphere. A silicon oxide compound of a higher oxidation grade, $SiO_x$, is then formed on the substrate. It has been found that protective layers of this type do not meet the high requirements of quality for automotive vehicle headlights if they are to be made under mass production conditions.

It is an object of the present invention to provide a new and improved method to apply a corrosion protective layer on reflective surfaces, and more particularly on head lamp reflectors, which is high in corrosion protection while having excellent optical properties, and more particularly to improve the corrosion protection of vehicle headlight reflectors and other lamp reflectors which have an aluminum reflective coating. The protective layers should, preferably, meet the requirements of having a long lifetime of the protected portion while being essentially optically neutral. Further, the process should be capable of being carried out with few steps, at low cost, and still providing high-qualtiy protection while being carried under mass production conditions. The process should be simple, easy to manage from a manufacturing point of view, so that errors in operation are eliminated as far as possible and rejects are effectively excluded or reduced to a minimum.

SUBJECT MATTER OF THE PRESENT INVENTION

Briefly, the reflectors are exposed to a monomeric gas, for example low molecular weight siloxanes having methyl-, vinyl- or phenyl groups, preferably hexamethyldisiloxane (HMDS), or methyl-, vinyl- or alkoxy silanes, preferably vinyltrimethyl silane (VTMS), from which the protective layer is deposited from the gas phase. The layers are hydrophobic, but it has been found particularly suitable, when applied to electric lamps, such as head-lamps and the like, if the hydrophobic protective layer, obtained by polymerization on the reflector, has its surface rendered hydrophilic by additional treatment, for example by admission of oxygen. The polymerization is effected under the influence of electron bombardment obtained by radiation, by thermal generation of electrons and multiplied by ionizing collision. This electron treatment is maintained also during the treatment to render the surface of the protective layer hydrophilic.

The process can be carried out particularly simply if the same vessel is used to vapor deposit metal on the object to be made into a reflector, typically reflector of the headlight, to apply the protective layer and to polymerize the protective layer on the thus formed reflector layer and to subsequently effect rendering the protective layer hydrophilic. The sequential steps can, therefore, be carried out in the same vessel and without requiring additional working steps to relocate the objects in different treatment environments.

Preferred starting substances are organosilicon compounds since they are simple to use in the process and have excellent protective properties. Pure organic compounds, preferably unsaturated low-molecular weight hydrocarbons or aromatics also provide good protective layers to protect against corrosion and permit polymerization from the gas phase.

BRIEF DESCRIPTION OF THE DRAWING

The invention will be described by way of example with reference to the accompanying drawings, wherein.

Figure 1:
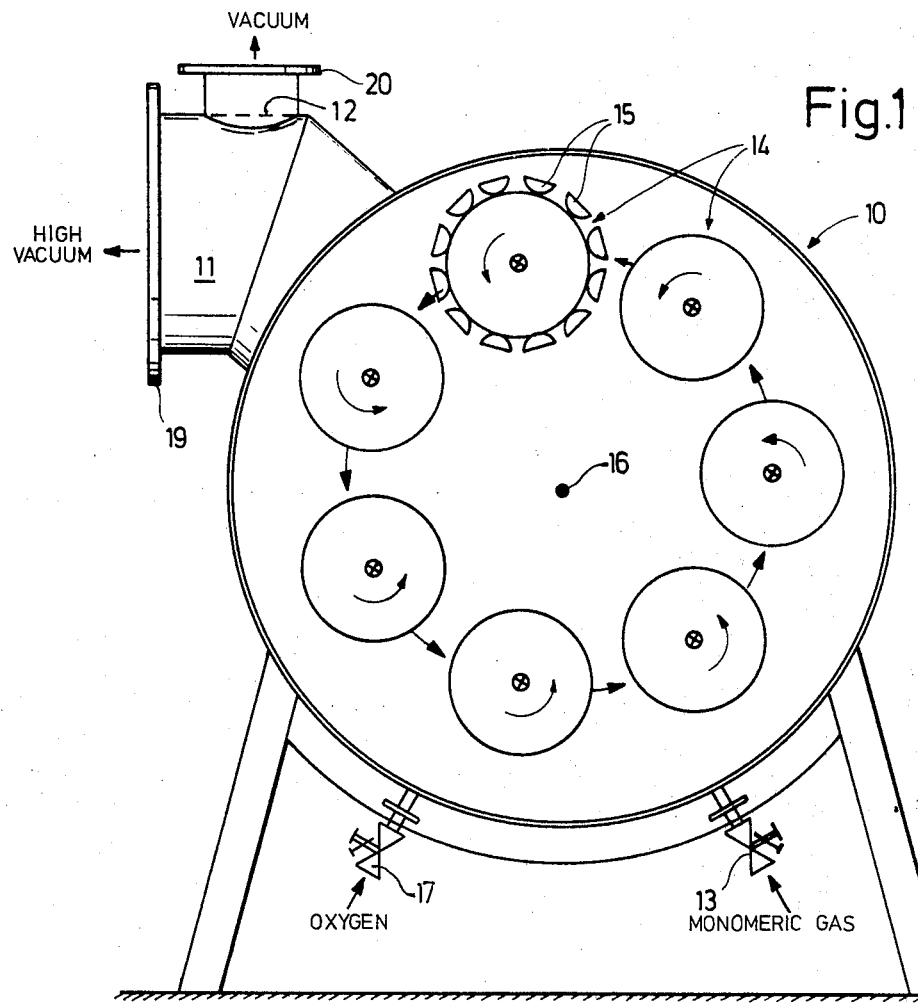
FIG. 1 is a highly schematic cross-sectional view of a treatment vessel, and the gas inlet and outlet connections used in accordance with the present invention.

A vessel 10 (FIG. 1) is connected by means of an exhaust stub 11 to a high-vacuum pump (not shown). A further stub pipe 12 is connected to a pre-vacuum pump or to a pump providing for preliminary evacuation of the vessel 1 before the high-vacuum used in carrying out the process is actually attained. An inlet, controlled by a valve 13, is located diametrically opposite the exhaust stub 11 through which a monomer gas can be introduced from a suitable supply, not shown. The supply vessel holds a polymerizable substance in liquid form from which the monomer gas is derived, the substance providing sufficient gas to flood the vessel 10 due to its high vapor pressure at the desired pressure in the vessel 10 when carrying out the process. Substrate carriers 14 are located within the vessel 10. The substrate carriers are cylindrical and can rotate about their axes as well as about the axis of vessel 10. Substrates 15, shown as vehicle headlight reflectors, are secured to the carriers 14.

The reflectors 15 of vehicle headlights, as shown in the drawings, are first coated, by vapor deposition, with a mirror layer of aluminum and, thereafter, have a protective layer applied to the aluminum mirror surface coating.

The vessel 10 is essentially cylindrical. An evaporating wire 16 of tungsten is located within the vessel 10. The tungsten wire 16 contains aluminum on its surface and can be heated to a temperature to vaporize the aluminum for deposition on the reflectors 15.

The vessel 10 is further connected to a valve 17 through which oxygen may be introduced into the vessel 10. Valve 13 and its inlet are located diametrically opposite from the high-vacuum exhaust stub 11 in order to provide for essentially uniform distribution of gases introduced thereto throughout the vessel 10.

The wire 16 can be used also as an electron generator to generate electrons for polymerization of the monomeric gas.

The tungsten wire 16 is heated during the polymerization phase of the process by connecting the wire to the secondary of a controllable high-current transformer 21 while, simultaneously, placing wire 16 at a voltage which is negative with respect to ground or chassis. Thus, electrode wire 16 can be connected through a switch S and through a current-limiting resistor Rv to the negative terminal of a source of direct current $U_g$, the positive terminal of which is placed on ground or chassis potential, which is also the terminal of the vessel 10. The primary voltage of the transformer 21 is shown at $U_p$ and may be at any suitable commercial power voltage; the secondary is shown at $U_s$ and should be capable of providing sufficient power at a suitable voltage depending on the length and resistance of the wire 16 to heat wire 16, selectively, to a temperature of about 1800° C.

The aluminum reflective surface is formed by well-known vapor deposition methods, see: L. Holland, "Vacuum Deposition of Thin Films," Chapman & Hall Ltd., London, 1956.

The starting substances introduced through valve 13 are, preferably, silicon organic compounds although pure organic compounds, preferably unsaturated low molecular weight hydrocarbons, also provide good protective layers upon polymerization from the gas phase. Suitable organic compounds are:

Olefins: ethylene, propylene and higher homologs.

Aromatic substances: benzene, toluene, xylene, styrene and the like.

The silicon organic substances have the advantage that they are particularly stable with respect to temperature and are almost insensitive with respect to other conditions, such as aging and discoloration. Further, they have less offensive odors when compared to most pure organic substances. The organic substances, on the other hand, have higher polymerization speeds.

Preferably, coating is effected by polymerization of low molecular weight siloxanes having methyl-, vinyl- or phenyl groups, preferably hexamethyldisiloxane (HMDS) or methyl-, vinyl- or alkoxy silanes, preferably vinyltrimethylsilane (VTMS).

The two preferred monomers are HMDS and VTMS. They are colorless, combustible liquids of low viscosity. The molecular weight of HMDS is 162, and that of VTMS is 100. HMDS has little odor, a viscosity of 0.6 cSt and at 20° C has a vapor pressure of 4 millibars. VTMS has a more intense odor, a lower viscosity, a higher vapor pressure, and is chemically more active since the double bond of the vinyl group is more easily broken. VTMS is easier to polymerize than HMDS, leading to higher growth rates. The polymer layers formed by the two substances have comparable characteristics. The polymerized VTMS layer tends to have reactive sites whereas the HMDS layer hardly has any free radicals. The silicone oil HMDS is easier to obtain in commerce and is cheaper than VTMS.

It cannot be prevented that incandescent lamps used together with the reflectors emit vapors which are derived from the lamp sealing substances, residual substances from soldering, and the like. These substances, particularly in a closed system having a hydrophobic surface, may condense thereon. The polymeric protective layer forms such a hydrophobic surface and the condensation deposits may become visible as droplets which cause optically dispersed light, so that the deposits become visible as coatings or coverings.

In order to ensure particularly good optical characteristics of reflectors made with the cover layer, the hydrophobic cover layer can have its surface rendered hydrophilic by treating the surface with oxygen. Preferably, and while electron emission used to enhance polymerization of the monomeric gases is continued, oxygen is admitted through valve 17 immediately after monomeric gas is shut off by closing of valve 13. Good results are obtained when the oxygen pressure is about one-third of the pressure of the monomeric gas, and the time of oxygen treatment is about 30% of the time used to generate the polymer protective layer.

The oxygen treatment eliminates deposits on the protective layers which interfere with the optical efficiency of the reflecting surface, since the vapors will condense on the hydrophilic substance of the protective layers as a homogeneous film. The advantage of the subsequent oxygen treatment, therefore, is in the uniform and thus practically invisible condensation of otherwise damaging vapors of the hydrophilic surfaces made as aforesaid, without effectively decreasing the corrosion protection of the hydrophobic polymer layers. Adhesion of lens elements and dispersion elements to the reflectors coated as aforesaid is improved by the surface which has been enriched for example by hydroxyl, carbonyl and carboxyl groups.

In accordance with a commercial process which is economically particularly advantageous, polymerization is carried out in the same vessel as that in which the metal vapor deposition is done. Thus, the substrates 15 are first metalized by metal vapor deposition and, thereafter, monomeric gas is introduced through valve 13. Valve 13 is a metering valve to admit gas from a supply vessel (not shown) in which the substance to be polymerized is contained in liquid form. The substrates 15 to be protected may remain in place on their carriers 14 and expensive and time-consuming steps to re-supply and re-stock a different apparatus are eliminated. Before the monomeric gas is admitted through valve 13, the vessel 10 is preferably evacuated to a pressure of less than $10^{-7}$ bar, and subsequently flooded with the monomeric gas. The method is accelerated and a particularly uniform protective layer is obtained when the monomeric gas is introduced as a constant flow or moving flooding of the vessel 10 by balancing the pressure loss due to connection of the vessel 10 to the vacuum pump by opening of the metering valve 13 for the monomeric gas.

Polymerization of the layer is effected in accordance with the invention by the gas discharge, caused by thermal emission of electrons from the heated wire 16 and amplified by the gas within vessel 10. The entire system is simply constructed when using thermal electron emission to generate the hydrophobic protective layer. Thermal generation of electrons permits economical use of materials. Thermal emission has the additional advantage that coating is essentially uniformly effected entirely around the electrode, that is, with respect to an angle of effectively 360°.

To effect polymerization by thermally generated electron bombardment, wire 16, after having served as an evaporator wire for the aluminum mirror surface, is heated to a second, and higher temperature sufficient to emit electrons, while closing switch S to place the wire 16 at a negative voltage with respect to substrates 15. Thus, the protective layer can be made in the very same vessel 10 as the mirror coating and no specific arrangements within the vessel 10 are needed to effect polymerization.

Wire 16 preferably is a tungsten or tantalum wire. The temperature to which the wire 16 is heated before monomeric gas is admitted is preferably in the order of about 1800° C; the gas pressure, by evacuation by a high-vacuum pump connected to flange 19 of stub 11, is in the order of $10^{-7}$ bar. When this pressure (or, rather, vacuum is reached, valve 13 is opened and vessel 10 is flooded with the monomeric gas at a pressure of about $5 \times 10^{-6}$ bar; due to the high vapor pressure above the monomeric liquid, no additional equipment is needed.

The protective layer, preferably a silicon organic layer, is chemically inactive, temperature-stable and very difficult to dissolve. It is particularly resistant against environmental influences arising under conditions when used as vehicle lamps, for example it is particularly resistant against salt solutions or sprays due to salting of roads, and is equally resistant against other influences of corrosion arising in vehicular environments. The coatings are, therefore, particularly suitable as protective layers for aluminum mirror surface reflectors of automotive vehicles. The protective layer is clear, colorfast and mechanically strong, making it additionally eminently suitable for vehicle lights. It is, further, optically neutral and is not damaged by cleaning. Lower molecular weight substances are particularly suitable due to their higher vapor pressure so that the vessel 10 can readily be flooded through metering valve 13 without any additional apparatus being necessary. The aforementioned substances HMDS and VTMS have a particularly low molecular weight and are especially suitable. HMDS provides a protective layer which is chemically somewhat more stable than that of VTMS, whereas VTMS has the advantage of much more rapid polymerization so that the growth rate is higher and, consequently, production is higher.

The protective layer generated within vessel 10, that is, the same vessel in which also the metal vapor deposition is done, is obtained by continuous flooding and flow of monomeric gas through the vessel 10 by connecting the vessel 10 at flange 19 to a vacuum pump and compensating the resulting pressure drop by suitable adjustment of the valve 13.

Figure 2:
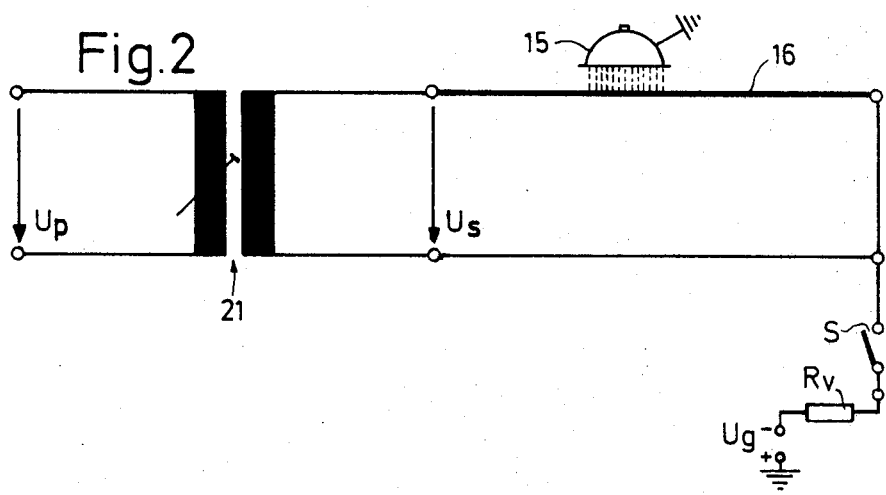
FIG. 2 is a schematic circuit diagram illustrating a circuit connection of the elements in accordance with the present invention.

To carry out the process, reflector substrates 15 are secured to carriers 14, and the apparatus is started to rotate the reflectors 15 about the axes of carriers 14 while the carriers 14 themselves rotate about the central axis of vessel 10. Thereafter, wire 16 which is suitably coated with an evaporating aluminum substance, and with switch S (FIG. 2) open, is heated to a temperature suitable for evaporation of the aluminum thereon by suitably adjusting the transformer 21 to provide the appropriate output voltage $U_s$. The voltage can readily be determined from the resistance of wire 16, its length, and its other characteristics. The vessel 10 may have been evacuated, for example by connecting a vacuum pump to flange 20; the aluminum deposition to provide a mirror surface is well known. After the reflector substrates 15 have been mirror coated, transformer 21 is controlled to provide a higher voltage to wire 16 to heat the wire 16 to a temperature of about 1800° C. Thermal emission of electrons will result. The vessel is, further, evacuated to the vacuum of $10^{-7}$ bar. Monomeric gas is then introduced through valve 13 until the vessel 10 has a pressure of about $5 \times 10^{-6}$ bar. The space charge surrounding the incandescent wire 16 is removed, and the electrons are accelerated in the direction of the substrates 15 which are connected to ground, by closing switch S which applies a bias voltage of about 300 V to the wire 16. The discharge is stabilized by the resistor $R_v$. The value of the resistor, as well as the bias voltage, can readily be determined and must be fitted to the specific application, depending on the diameter, axial length and constructional features of the apparatus.

The electrons generated within vessel 10 and accelerated therein are multiplied by ionizing collision, so that substrates 15 will have an amplified current applied thereto, the energy of which results in cross-linking of the adsorbed gas molecules. The growth rates obtained in the systems are in the order of between 2 to 8 nm/min.

Various changes and modifications may be made; for example, the electron emission can be generated by using a wire which is different from that used for vaporizing aluminum to form the mirror surface.

The protective layer formed by polymerization is hydrophobic. To obtain a hydrophilic surface thereon, treatment with oxygen is carried out immediately after polymerization of the hydrophobic layer. Valve 13 which had supplied monomeric gas is closed and valve 17 supplying $O_2$ is opened. The electron generation used during polymerization, by heating of wire 16, is continued so that the electron generation is effective during oxygen treatment. The time to effect hydrophilic treatment of the surface is about 30% of that to make the polymeric layer at a pressure of about ⅓ of the pressure of the monomeric gas, that is, about $2 \cdot 10^{-6}$ bar for the above conditions. During oxygen treatment, the surface of the polymeric layers will chemically bond or combine with oxygen to form hydroxyl carbonyl and carboxyl groups, thereby rendering the surface hydrophilic. Treatment of the substrates 15 within the vessel 10 by oxygen has an additional advantage besides that applicable to the substrates 15 themselves since the oxygen treatment also affects the tungsten wire 16. Unless the oxygen treatment is carried out, coatings of tungsten carbide or other tungsten compounds will form at the surface of the wire 16 which substantially reduces the electron emission. The wires, therefore, have to be replaced frequently after having been used for several process cycles. If oxygen is admitted through valve 17, the lifetime of wire 16 is limited, effectively, only by its mechanical strength, thus increasing the use time of the wire 16 by two to three times that if the oxygen treatment were not carried out. The oxygen treatment oxidizes the tungsten carbide, the carbon being displaced by its bonding with oxygen from the formation on the tungsten wire and removed as a gas by the vacuum pump connected to flanges 19, or 20, respectively.

Various other changes and modifications may be made within the scope of the inventive concept. For example, the pressure and the temperature and voltage conditions as set forth herein are not critical. For electron emission, the wire 16 may be heated to a temperature of between 1600° to 2000° C, although the temperature of 1800° C is preferred. The pressure during which the monomeric gas floods vessel 10 can be in the range of $10^{-6}$ to $10^{-5}$ bar, preferably in the order of $5 \times 10^{-6}$ bar. The negative voltage applied to wire 16 during the polymerization stage can vary, for example, between about 100 V to 500 V, but preferably is in the order of about 300 V with respect to the substrates 15.

EXAMPLE

A vessel 10 of 1.5 meters diameter and having an axial length of 2 meters had 7 planetary carriers 14 located therein, to which 280 substrates 15, forming automotive lights, were attached.

Wire 16 was a twisted, bifilar tungsten wire of $2 \times 2$ mm diameter, stretched axially approximately centrally in the vessel. It was charged with 10 g Al.

Vessel 10 was then evacuated to a vacuum of $\leq 10^{-7}$ bar. Current of 200 A was passed through wire 16 heating it to a temperature of about 1600° C, thereby vaporizing the aluminum which was deposited on the substrates 15. The substrates 15 were rotated about the axis of the respective carrier 14 at a speed of 20 rpm, the entire planet arrangement rotating about wire 16 at a speed of 3 rpm.

Mirror deposition was effected in 2 minutes. Thereafter, and with the substrates 15 rotating as before, vessel 10 was flooded to a vacuum of about $5 \cdot 10^{-6}$ bar; introducing HMDS through valve 13. Current of 270 A was passed through wire 16 to heat it to a temperature of about 1800° C, and this condition was maintained for about 5 minutes. While continuing the same current flow through wire 16, the residual gas in vessel 10 was changed to $2 \cdot 10^{-6}$ bar oxygen, which was admitted through valve 17 for a period of time of 2 min. The discharge current is in the order of about 2A, the resistor $R_v$ of about 400Ω.

The reflectors had an aluminum mirror coating applied on which a polymerized, protective layer of 20 nm was formed, having a hydrophilic surface, on top of an aluminum layer of 100 nm thickness on a lacquered metal substrate of 1 mm thickness.

The thickness of the hydrophobic protective layer should be sufficient to provide the protection desired and still be colourless. This is obtained for layers polymerized from HMDS, for example, in thicknesses of 10 to 60 nm preferably between 20 to 30 nm. In general, for suitable protection the thickness of the protective layer should not be less than about 10 nm, The substrates on which the reflective coating is formed may be glass, plastic, or a lacquered metal such as nonalloyed steel. The term "monomeric gas," besides the preferred materials given in the description, generally includes monomeric gases with a vapour pressure of more than $10^{-5}$ bar at 20° C, polymerizable to hydrophobic layers.

The growth rates described herein refer to the combined deposition and polymerisation rate of the organic monomeric gas on the substrates.

We claim:

1. Method to apply a protective layer to the surface of optical reflectors in an evacuated vacuum vessel (10) comprising the steps of
    locating an electron emissive wire (16) in said vessel,
    locating a mass of reflecting metal in said vessel,
    locating reflector substrates (15) in said vessel,
    heating said mass of reflecting metal to the evaporation temperature of said reflecting metal to vaporize said metal and deposit a thin reflective layer of said metal on said reflector substrates, then
    exposing the metal coated reflector substrates to an organic monomeric gas,
    generating electrons by heating said electron emissive wire (16) to a temperature sufficiently high to emit electrons and biassing said wire (16) to a negative voltage with respect to said reflector substrates (15) thereby polymerizing the gas at the surface of the substrate to form a protective hydrophobic polymer layer from said monomer by polymerization from the gas phase by exposure to
    electrons generated by thermal emission from said heated electron emissive wire.

2. Method according to claim 1, wherein said monomeric gas comprises an organasilicon compound and the protective layer is formed by polymerization thereof.

3. Method according to claim 1, wherein said monomeric gas comprises low molecular weight siloxanes having methyl-, vinyl- or phenyl-groups.

4. Method according to claim 1, wherein said substance comprises hexamethyldisiloxane (HMDS).

5. Method according to claim 1, wherein said monomeric gas comprises methyl-, vinyl- or alkoxy silane.

6. Method according to claim 1, wherein said monomeric gas comprises vinyltrimethylsilane (VTMS).

7. Method according to claim 1, wherein the reflecting metal is aluminum.

8. Method according to claim 1, wherein said biassing comprises applying a negative bias voltage in the order of about 100 to 500 V, to said wire (16).

9. Method according to claim 1, wherein the heating of the wire (16) to an, electron-emitting temperature comprises heating the wire to a temperature of between about 1600° C to 2000° C.

10. Method according to claim 1, further comprising the step of evacuating the vessel (10) to a vacuum of at least $10^{-7}$ bar, and then carrying out the steps of exposing the reflector to the monomeric gas by introducing the monomeric gas into the vessel to obtain a vacuum within the vessel of between about $10^{-6}$ to $10^{-5}$ bar.

11. Method according to claim 2, wherein oxygen is introduced into said vessel and the generation of said electrons by electric heating of said wire (16) is continued during the introduction of said oxygen.

12. Method according to claim 11, wherein the step of rendering hydrophilic the surface of the hydrophobic protective layer comprises admitting oxygen to the vessel at a pressure of about one-third of the gas pressure of the monomeric gas and for a period of time of about 30% of that during which the protective layer is formed by deposition and polymerization.

13. Method according to claim 11, wherein said oxygen is a component of air admitted to said vessel.

14. Method for applying a transparent protective layer to protect the surface of optical reflectors comprising a reflector substrate having at least one metal reflecting surface, and a polymerized organosilicon protective layer on said metal layer comprising
    supporting a reflector substrate having at least one metal reflecting surface in an evacuated vacuum vessel,
    providing gaseous organosilicon in said vessel,
    generating electrons in said vessel by heating an electron emissive substance to a temperature sufficiently high to emit electrons thereby causing said organosilicon to form a hydrophobic polymerized organosilicon layer on said metal reflecting surface, and then, while continuing the generating of electrons, oxygen is incorporated into the surface of said polymer layer.

15. Th method of claim 14 comprising locating a reflector substrate in said evacuated vacuum vessel, then vapor depositing a layer of a reflecting metal on at least one reflective surface of said substrate, and then introducing said gaseous organosilicon monomer into said vessel.

16. The method of claim 15 wherein said evacuated vacuum vessel has a vacuum of at least $10^{-7}$ bar, and then introducing said gaseous organosilicon monomer into the vessel to obtain a vacuum within the vessel of between about $10^{-6}$ to $10^{-5}$ bar.

17. The method of claim 15 wherein said electron emissive substance is heated to a temperature of between about 1600° C and 2000° C.

18. The method of claim 15 wherein said organosilicon monomer comprises low molecular weight siloxanes containing substituents selected from the group consisting of methyl groups, vinyl groups, and phenyl groups.

19. Method according to claim 15, wherein said organosilicon monomer is hexamethyldisiloxane.

20. Method according to claim 15 wherein said organosilicon monomer is a silane having substituents selected from the group consisting of methyl groups, vinyl groups, and alkoxy groups.

21. Method according to claim 15 wherein said organosilicon monomer is vinyltrimethylsilane.

22. Method according to claim 15 wherein said oxygen is introduced into said vessel by introducing air into said vessel.

23. The method of claim 15 wherein said oxygen is admitted into said vessel at a pressure of about ⅓ of the gas pressure of said gaseous organosilicon monomer and wherein the period of time during which said oxygen is introduced into said vessel is about 30% of the time during which the protective layer is formed by deposition and polymerization on said metal surfaced reflector substrate.

24. Method of claim 14 wherein said vessel containing said gaseous organosilicon is at a vacuum of between about $10^{-6}$ to $10^{-5}$ bar.

25. The method of claim 24 wherein said electron emissive substance is biassed to a negative voltage with respect to said reflector substrates and wherein said electron emissive substance is heated to a temperature of between about 1600° C and 2000° C.

26. The method of claim 25 wherein said organosilicon has a vapour pressure of more than $10^{-5}$ bar at 20° C.

27. The method of claim 26 wherein said metal reflecting surface is an aluminum reflecting surface.

28. The method of claim 27 wherein said gaseous organosilicon is selected from the group consisting of hexamethyldisiloxane and vinyltrimethylsilane.

29. The method of claim 28 wherein said oxygen is admitted into said vessel at a pressure of about ⅓ of the gas pressure of said gaseous organosilicon.

30. The method of claim 29 wherein said oxygen is admitted into said vessel for a period of time which is about 30% of the time during which said polymerized organosilicon layer is formed.

31. The method of claim 26 wherein said organosilicon is a low molecular weight siloxane containing substituent groups selected from the group consisting of methyl, vinyl and phenyl groups.

32. The method of claim 26 wherein said organosilicon is a silane selected from the group consisting of methyl-, vinyl-, and alkoxy silanes.

33. A coated optical reflector having at least one reflective surface comprising
a reflector substrate coated on its reflective surface with a thin reflective layer of a reflecting metal,
said layer of reflecting metal being coated with a clear protective layer, and
said protective layer consisting essentially of a hydrophobic polymerized organosilicon in contact with said reflecting metal and having its surface enriched with oxygen.

34. The coated optical reflector of claim 33 wherein said protective layer is between about 10 and 60 nm thick.

35. The coated optical reflector of claim 33 wherein said reflecting metal is aluminum.

36. The coated optical reflector of claim 33 wherein said polymerized organosilicon is polymerized vinyltrimethylsilane.

37. The coated optical reflector of claim 33 wherein said polymerized organosilicon is polymerized hexylmethyldisiloxane.

38. The coated optical reflector of claim 33 wherein said protective layer is between about 20 and 30 nm thick.

39. The coated optical reflector of claim 33 wherein said organosilicon has a vapor pressure of more than $10^{-5}$ bar at 20° C.

40. The coated optical reflector of claim 33 wherein said organosilicon is a low molecular weight siloxane containing substituent groups selected from the group consisting of methyl, vinyl and phenyl groups.

41. The coated optical reflector of claim 33 wherein said organosilicon is a silane selected from the group consisting of methyl-, vinyl-, and alkoxy silanes.

42. The coated optical reflector of claim 36 wherein said reflecting metal is aluminum.

43. The coated optical reflector of claim 37 wherein said reflecting metal is aluminum.

44. The coated optical reflector of claim 39 wherein said reflecting metal is aluminum.

45. The coated optical reflector of claim 40 wherein said reflecting metal is aluminum.

46. The coated optical reflector of claim 41 wherein said reflecting metal is aluminum.

47. The coated optical reflector of claim 34 wherein said reflecting metal is aluminum.

48. The coated optical reflector of claim 47 wherein said polymerized organosilicon is a polymerized low molecular weight siloxane having substituents selected from the group consisting of methyl, vinyl, and phenyl groups.

49. The coated optical reflector of claim 47 wherein said polymerized organosilicon is polymerized hexamethyldisiloxane.

50. The coated optical reflector of claim 47 wherein said polymerized organosilicon is selected from the group consisting of polymerized methylsilane, vinylsilane, and alkoxysilane.

51. The coated optical reflector of claim 42 wherein said polymerized organosilicon is polymerized vinyltrimethylsilane.

52. Apparatus to apply a protective layer to the surface of optical reflectors comprising a vacuum vessel (10), and means (14) within the vessel supporting reflector substrates (15) therein;

said vessel further comprising an electron discharge generating electrode wire (16) located within the vessel to thermally generate an electron discharge therein; and means (21) to heat the wire to electron emission and wherein the means (21) to heat the wire and is a controllable source of electrical current to heat the electrode wire selectively to: (a) a temperature at which reflecting metal can be evaporated, and (b) a temperature at which electrons are emitted whereby a single wire will serve, simultaneously, as a metal vaporizer and as an electron generator.

* * * * *

UNITED STATES PATENT AND TRADEMARK OFFICE
CERTIFICATE OF CORRECTION

PATENT NO. : 4,085,248
DATED : April 18, 1978
INVENTOR(S) : ERNST ZEHENDER et al It is certified that error appears in the above-identified patent and that said Letters Patent are hereby corrected as shown below:

Column 8, lines 24-25, in Claim 4:
    replace "substance" with ---monomeric gas---.

Signed and Sealed this

Twenty-ninth Day of May 1979

[SEAL]

Attest:

RUTH C. MASON
Attesting Officer

DONALD W. BANNER
Commissioner of Patents and Trademarks